(12) United States Patent
Jeon et al.

(10) Patent No.: US 11,574,987 B2
(45) Date of Patent: Feb. 7, 2023

(54) ELECTRONIC APPARATUS AND METHOD OF MANUFACTURING THE SAME

(71) Applicant: Samsung Display Co., LTD., Yongin-si (KR)

(72) Inventors: Kyungjin Jeon, Incheon (KR); Soyoung Koo, Yongin-si (KR); Eok Su Kim, Seoul (KR); Hyungjun Kim, Seoul (KR); Yunyong Nam, Hwaseong-si (KR); Jun Hyung Lim, Seoul (KR)

(73) Assignee: SAMSUNG DISPLAY CO, , LTD., Yongin-si (KR)

( * ) Notice: Subject to any disclaimer, the term of this patent is extended or adjusted under 35 U.S.C. 154(b) by 18 days.

(21) Appl. No.: 17/223,505

(22) Filed: Apr. 6, 2021

(65) Prior Publication Data

US 2021/0343822 A1 Nov. 4, 2021

(30) Foreign Application Priority Data

Apr. 29, 2020 (KR) ......................... 10-2020-0052765

(51) Int. Cl.
*H01L 27/32* (2006.01)
(52) U.S. Cl.
CPC .... *H01L 27/3276* (2013.01); *H01L 2227/323* (2013.01)

(58) Field of Classification Search
None
See application file for complete search history.

(56) References Cited

U.S. PATENT DOCUMENTS

| 9,443,886 B2 | 9/2016 | Oh et al. |
| 9,952,473 B2 | 4/2018 | Jeong et al. |
| 2019/0035875 A1* | 1/2019 | Xin ........................ H01L 27/124 |

FOREIGN PATENT DOCUMENTS

| KR | 10-2016-0029487 | 3/2016 |
| KR | 10-2017-0078075 | 7/2017 |
| KR | 10-2017-0126087 | 11/2017 |

* cited by examiner

*Primary Examiner* — Nicholas J Lee
(74) *Attorney, Agent, or Firm* — Kile Park Reed & Houtteman PLLC

(57) ABSTRACT

An electronic apparatus includes a first transistor including a first oxide semiconductor pattern, a second transistor including a second oxide semiconductor pattern, a blocking layer including a conductive material, a signal line including a first line and a second line which are disposed on different layers, and a bridge pattern electrically connected to each of the first transistor, the first line of the signal line, and the second line of the signal line, wherein the first line of the signal line and the blocking layer are disposed on a same layer, and the second line of the signal line and the first oxide semiconductor pattern are disposed on a same layer.

20 Claims, 18 Drawing Sheets

ELECTRONIC APPARATUS AND METHOD OF MANUFACTURING THE SAME

CROSS-REFERENCE TO RELATED APPLICATIONS

This application claims priority to and benefits of Korean Patent Application No. 10-2020-0052765 under 35 U.S.C. § 119, filed in the Korean Intellectual Property Office on Apr. 29, 2020, the entire contents of which are incorporated herein by reference.

BACKGROUND

1. Technical Field

The disclosure herein relates to a display apparatus and a method for manufacturing the same, and, to a display apparatus comprising an oxide semiconductor and a method for manufacturing the display apparatus.

2. Description of the Related Art

An electronic apparatus may include a display panel for displaying an image. The display panel may include signal lines and pixels that may be electrically connected to the signal lines. Each of the pixels may include driving elements and a light emitting element, and may be driven by receiving an electrical signal through signal lines electrically connecting the driving elements and the light emitting element.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic apparatus which may be driven at a high speed and a method for manufacturing an electronic apparatus with reduced processing cost.

An embodiment provides an electronic apparatus that may include a first transistor comprising a first oxide semiconductor pattern; a second transistor comprising a second oxide semiconductor pattern spaced apart from the first oxide semiconductor pattern of the first transistor; a blocking layer disposed below the second transistor and including a conductive material; a signal line electrically connected to the first transistor and comprising a first line and a second line which are disposed on different layers; a bridge pattern electrically connected to each of the first transistor, the first line of the signal line, and the second line of the signal line; a first insulation layer disposed between the first line of the signal line and the second line of the signal line; and a second insulation layer disposed between the first transistor and the bridge pattern, wherein the first line of the signal line and the blocking layer may be disposed on a same layer, and the second line of the signal line and the first oxide semiconductor pattern may be disposed on a same layer.

In an embodiment, the second line of the signal line may include a first layer and a second layer which are sequentially stacked.

In an embodiment, the first layer of the second line of the signal line may include an oxide semiconductor.

In an embodiment, the first layer of the second line of the signal line may include tin.

In an embodiment, the second layer of the second line of the signal line may include a crystalline structure.

In an embodiment, the second layer of the second line of the signal line may include a transparent conductive oxide.

In an embodiment, the first layer of the second line of the signal line and the first oxide semiconductor pattern may include a same material.

In an embodiment, the bridge pattern may electrically contact the first semiconductor pattern through the second insulation layer.

In an embodiment, the electronic apparatus may further include a light emitting element including an anode electrode electrically connected to the second transistor; a cathode electrode disposed on the anode electrode; and a light emitting pattern disposed between the anode electrode and the cathode electrode, wherein the bridge pattern and the anode electrode may be disposed on a same layer.

In an embodiment, the anode electrode may be electrically connected to the second semiconductor pattern and the blocking layer.

In an embodiment, an electronic apparatus may include a first transistor comprising an oxide semiconductor pattern; a first line spaced apart from the first transistor in a plan view; a second line spaced apart from the first transistor in a plan view, wherein the first line and the second line may be disposed on different layers and may include a different material; a blocking layer overlapping the oxide semiconductor pattern of the first transistor, the blocking layer and the first line being disposed on a same layer; and a bridge pattern electrically connected to the first transistor, the first line, and the second line, wherein the bridge pattern, the first line, and the second line may be disposed on different layers. The second line may include a first layer including the oxide semiconductor pattern; and a second layer disposed on the first layer and including a conductive oxide.

In an embodiment, the oxide semiconductor pattern and the second line may be disposed on a same layer.

In an embodiment, the first layer may include tin.

In an embodiment, the second layer may include a crystalline structure.

In an embodiment, the first line and the blocking layer may include a same material.

In an embodiment, a method for manufacturing an electronic apparatus may include forming a blocking layer and a first line on a base substrate; forming an insulation layer overlapping the blocking layer and the first line; forming an oxide semiconductor layer and a conductive oxide layer sequentially on the insulation layer; patterning the oxide semiconductor layer and the conductive oxide layer to form a first pattern, a second pattern, and a third pattern spaced apart from each other; removing the conductive oxide layer of each of the first pattern and the second pattern; heat-treating the conductive oxide layer of the third pattern to form a second line; and forming a bridge pattern electrically connecting the second line and the first line.

In an embodiment, the oxide semiconductor layer may include a semiconductor material including tin.

In an embodiment, the removing of the conductive oxide layer of each of the first pattern and the second pattern may be performed using a sulfate-based or nitrate-based etchant.

In an embodiment, the forming of the first pattern, the second pattern, and the third pattern spaced apart from each other may be formed using a half-tone mask.

In an embodiment, the method may further include forming an anode electrode, a light emitting pattern, and a cathode electrode after the forming of the second line, wherein the forming of the anode electrode may include forming the anode electrode and the bridge pattern simultaneously.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
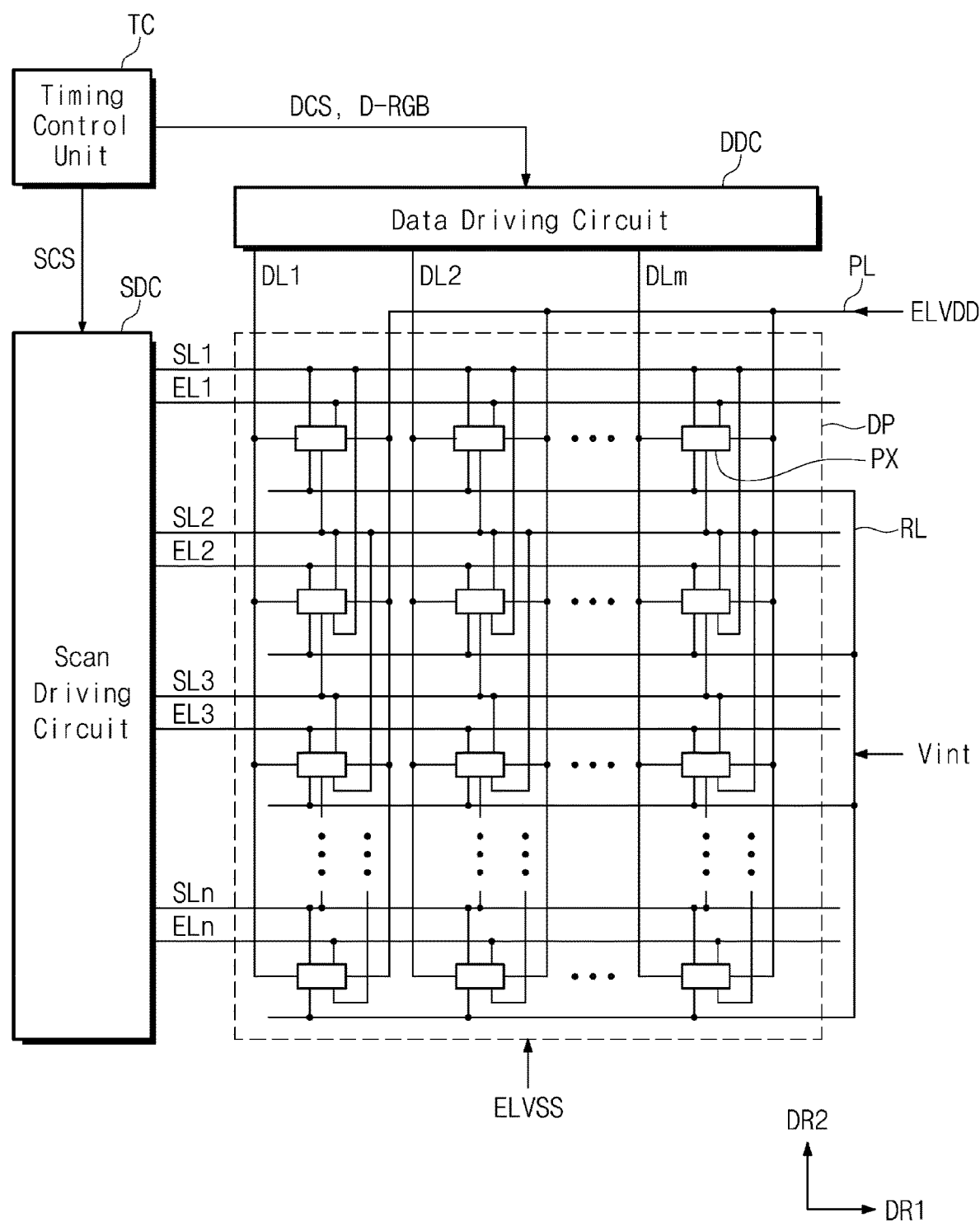
FIG. 1 is a block diagram of an electronic apparatus according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should be understood that the terms "comprise" and variations such as "comprises" or "comprising", "include" and its variations such as "includes" or "including", "have" or "having" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments will be described with reference to the accompanying drawings.

FIG. 1 is a block diagram of an electronic apparatus according to an embodiment. A display apparatus according to the disclosure may be a semiconductor apparatus including at least one semiconductor. The electronic apparatus may include a timing control unit TV, a scan driving circuit SDC, a data driving circuit DDC, and a display panel DP. The display panel DP may display an image according to an electrical signal.

In an embodiment, the display panel DP is illustratively described as being an organic light emitting display panel. However, this is an example. The display panel DP according to the disclosure may include various embodiments.

The timing control unit TC may receive input image signals (not shown) and may convert a data format of the input image signals to match specifications of an interface with the scan driving circuit SDC to generate image data D-RGB. The timing control unit TC may output the image data D-RGB and various control signals DCS and SCS.

The scan driving circuit SDC may receive a scan control signal SCS from the timing control unit TC. The scan control signal SCS may include a vertical start signal for starting the operation of the scan driving circuit SDC and a clock signal for determining the output timing of signals.

The scan driving circuit SDC may generate scan signals and may sequentially output the scan signals to scan lines SL1 to SLn. Also, the scan driving circuit SDC may generate light emission control signals in response to the scan control signal SCS, and may output the light emission control signals to light emission lines EL1, EL2, EL3 . . . to ELn.

In FIG. 1, scan signals and light emission control signals are illustrated as being output from one scan driving circuit SDC, but an embodiment is not limited thereto. In an embodiment, scan driving circuits may divide and output the scan signals and may divide and output the emission control signals. In an embodiment, a driving circuit generating and outputting the scan signals and a driving circuit generating and outputting the light emission control signals may be different from each other.

The data driving circuit DDC may receive a data control signal DCS and the image data D-RGB from the timing control unit TC. The data driving circuit DDC may convert the image data D-RGB into data signals and may output the data signals to data lines DL1, DL2 . . . to DLm. The data signals may be analog voltages corresponding to gray scale values of the image data D-RGB.

The display panel DP may include the scan lines SL1 to SLn, the light emission lines EL1, EL2, EL3 . . . to ELn, the data lines DL1, DL2 . . . to DLm, and pixels PX. The scan lines SL1 to SLn may be extended in a first direction DR1 and arranged or disposed in a second direction DR2 intersecting the first direction DR1.

Each of the light emission lines EL1, EL2, EL3 . . . to ELn may be arranged or disposed in parallel to a corresponding scan line among the scan lines SL1 to SLn. The data lines DL1, DL2 . . . to DLm may intersect the scan lines SL1 to SLn while being insulated therefrom.

Each of the pixels PX may be electrically connected to a corresponding scan line among the scan lines SL1 to SLn, a corresponding light emission line among the light emission lines EL1, EL2, EL3 . . . to ELn, and a corresponding data line among the data lines DL1, DL2 . . . to DLm.

Each of the pixels PX may receive a power voltage ELVDD and a second voltage ELVSS that may be lower than the first power voltage ELVDD. The power voltage ELVDD may correspond to the power voltage ELVDD (see FIG. 1) described above. Each of the pixels PX may be electrically connected to a power line PL to which the power voltage ELVDD may be applied. Each of the pixels PX may be electrically connected to an initialization voltage line RL receiving an initialization voltage Vint.

Each of the of pixels PX may be electrically connected to three (3) scan lines. As shown in FIG. 1, pixels on a second pixel row may be electrically connected to first to third scan lines SL1 to SL3.

Meanwhile, the display panel DP may include dummy scan lines. The display panel DP may include a dummy scan line electrically connected to pixels PX of a first pixel row and a dummy scan line electrically connected to pixels PX of an n-th pixel row. Pixels (hereinafter, pixels of pixel rows) electrically connected to any one data line among the data lines DL1, DL2 . . . to DLn may be electrically connected to each other. Two adjacent pixels among the pixels of the pixel rows may be electrically connected to each other. However, this is an example. The connection relationship of the pixels PX according to an embodiment may be variously designed, and is not limited to any one embodiment.

Each of the of pixels PX may include an organic light emitting diode (not shown) and a pixel driving circuit (not shown) controlling the light emission of the light emitting diode. The pixel driving circuit unit may include thin-film transistors and a capacitor. Meanwhile, at least one of the scan driving circuit SDC and the data driving circuit DDC may include transistors formed through the same process as a process for forming the pixel driving circuit. However, this is only an example. In the electronic apparatus according to an embodiment, the scan driving circuit SDC or the data driving circuit DDC may be provided as a separate circuit board from the display panel DP, and is not limited to any one embodiment.

Figure 2:
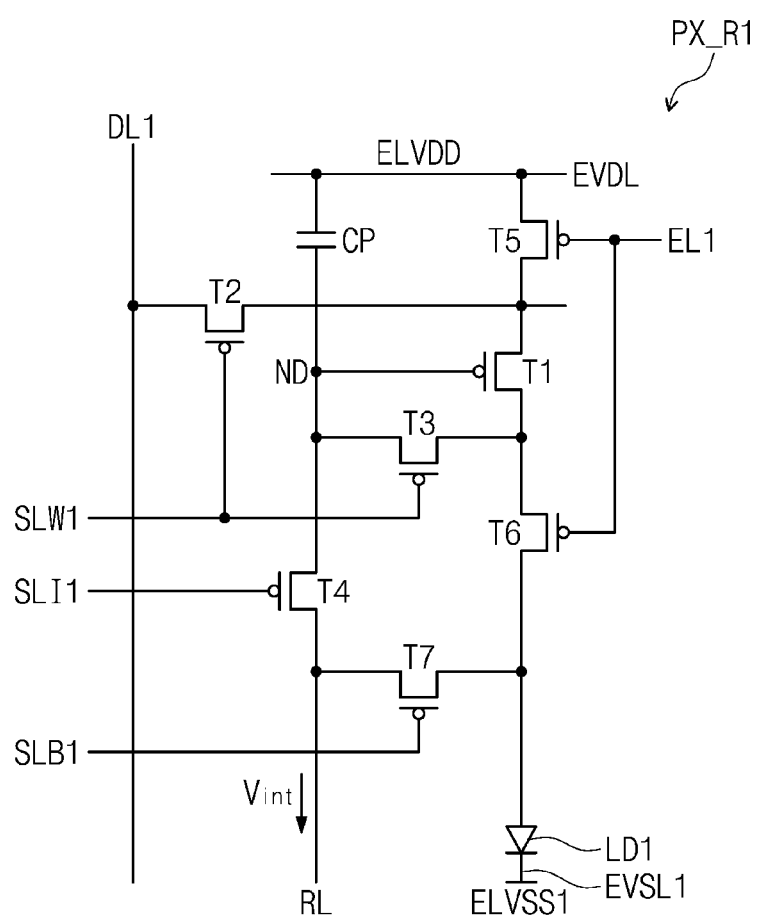
FIG. 2 is an equivalent circuit diagram of a pixel according to an embodiment.

FIG. 2 is an equivalent circuit diagram of a pixel according to an embodiment. FIG. 2 illustrates an equivalent circuit diagram of one pixel PX_R1 among the pixels PX illustrated in FIG. 1. Meanwhile, this is only an illustrated example. The equivalent circuit diagram of the pixel PX_R1 may be variously designed, and is not limited to any one embodiment.

Referring to FIG. 2, the pixel PX_R1 may include transistors T1 to T7, a capacitor CP, and a first light emitting element LD1. First to third scan lines SLW1, SLI1, and SLB1 may respectively correspond to the scan lines SL1, SL2, and SL3 (see FIG. 2). The transistors T1 to T7 and the capacitor CP may control the amount of current flowing in the first light emitting element LD1 in response to a data signal and a scan signal.

Each of the transistors T1 to T7 may include an input electrode (or a source electrode), an output electrode (or a drain electrode), and a control electrode (or a gate electrode). The input electrode of a first transistor T1 may be electrically connected to a driving power line EVDL via a fifth transistor T5. The driving power line EVDL may be a wiring provided with the driving power voltage ELVDD. The output electrode of the first transistor T1 may be electrically connected to an anode electrode of the first light emitting element LD1 by a sixth transistor T6.

The first transistor T1 may control the amount of current flowing in the first light emitting element LD1 in correspondence to a voltage applied to the control electrode of the first transistor T1.

A second transistor T2 may be electrically connected between a data line DL1 and the input electrode of the first transistor T1. The control electrode of the second transistor T2 may be electrically connected to a second scan line SLW1. In a case that a second scan signal is provided to the second scan line SLW1, the second transistor T2 may be turned on to electrically connect the data line DL1 and the input electrode of the first transistor T1.

A third transistor T3 may be electrically connected between the output electrode of the first transistor T1 and the control electrode of the first transistor T1. The control electrode of the third transistor T3 may be electrically connected to the second scan line SLW1. In a case that the second scan signal is provided to the second scan line SLW1, the third transistor T3 may be turned on to electrically connect the output electrode of the first transistor T1 and the control electrode of the first transistor T1. Accordingly, in a case that the third transistor T3 may be turned on, the first transistor T1 may be connected in the form of a diode.

A fourth transistor T4 may be electrically connected between a node ND and the initialization voltage line RL. The control electrode of the fourth transistor T4 may be electrically connected to a first scan line SLI1. The node ND may be a node to which the fourth transistor T4 and the control electrode of the first transistor T1 may be electrically connected. In a case that a first scan signal is provided to the first scan line SLI1, the fourth transistor T4 may be turned on to provide the initialization voltage Vint to the node ND. Here, the first scan signal may be a signal generated prior to the second scan signal. For example, the first scan signal may be the same signal as a signal applied to the second scan line SLW1 of a pixel in the previous row.

A fifth transistor T5 may be electrically connected between the driving power line EVDL and the input electrode of the first transistor T1. A sixth transistor T6 may be electrically connected between the output electrode of the first transistor T1 and the anode electrode of the first light emitting element LD1. The control electrode of the fifth transistor T5 and the control electrode of the sixth transistor T6 may be electrically connected to a first light emitting control wiring EL1.

A seventh transistor T7 may be electrically connected between the initialization voltage line RL and the anode electrode of the first light emitting element LD1. The control electrode of the seventh transistor T7 may be electrically connected to a third scan line SLB1. In a case that a third scan signal is provided to the third scan line SLB1, the seventh transistor T7 may be turned on to provide the initialization voltage Vint to the anode electrode of the first light emitting element LD1. For example, the third scan signal may be the same signal as a signal applied to the first scan line SLI1 of a pixel in the next row.

FIG. 2 illustrates the control electrode of the seventh transistor T7 being electrically connected to the third scan line SLB1, but an embodiment is not limited thereto. In an embodiment, the control electrode of the seventh transistor T7 may be electrically connected to the second scan line SLW1.

In FIG. 2, the first to seventh transistors T1 to T7 are each illustrated as being a PMOS transistor, but an embodiment is not limited thereto. In an embodiment, some or a predetermined number, or all of the first to seventh transistors T1 to T7 may be each configured to be an NMOS transistor.

The capacitor CP may be disposed between the driving power line EVDL and the node ND. The capacitor CP may store a voltage corresponding to a data signal. In a case that the fifth transistor T5 and the sixth transistor T6 are turned on in response to the voltage stored in the capacitor CP, the amount of current flowing in the first transistor T1 may be determined.

The first light emitting element LD1 may be electrically connected to the sixth transistor T6 and a first source power line EVSL1. The anode electrode of the first light emitting element LD1 may be electrically connected to the sixth transistor T6, and a cathode electrode of the first light emitting element LD1 may be electrically connected to the first source power line EVSL1. A first source power voltage ELVSS1 may be applied to the first source power line EVSL1. The first source power voltage ELVSS1 may have a lower level than the driving power voltage ELVDD. Therefore, the first light emitting element LD1 may emit light according to a voltage corresponding to the difference between a signal transmitted through the sixth transistor T6 and the first source power voltage ELVSS1.

Figure 3:
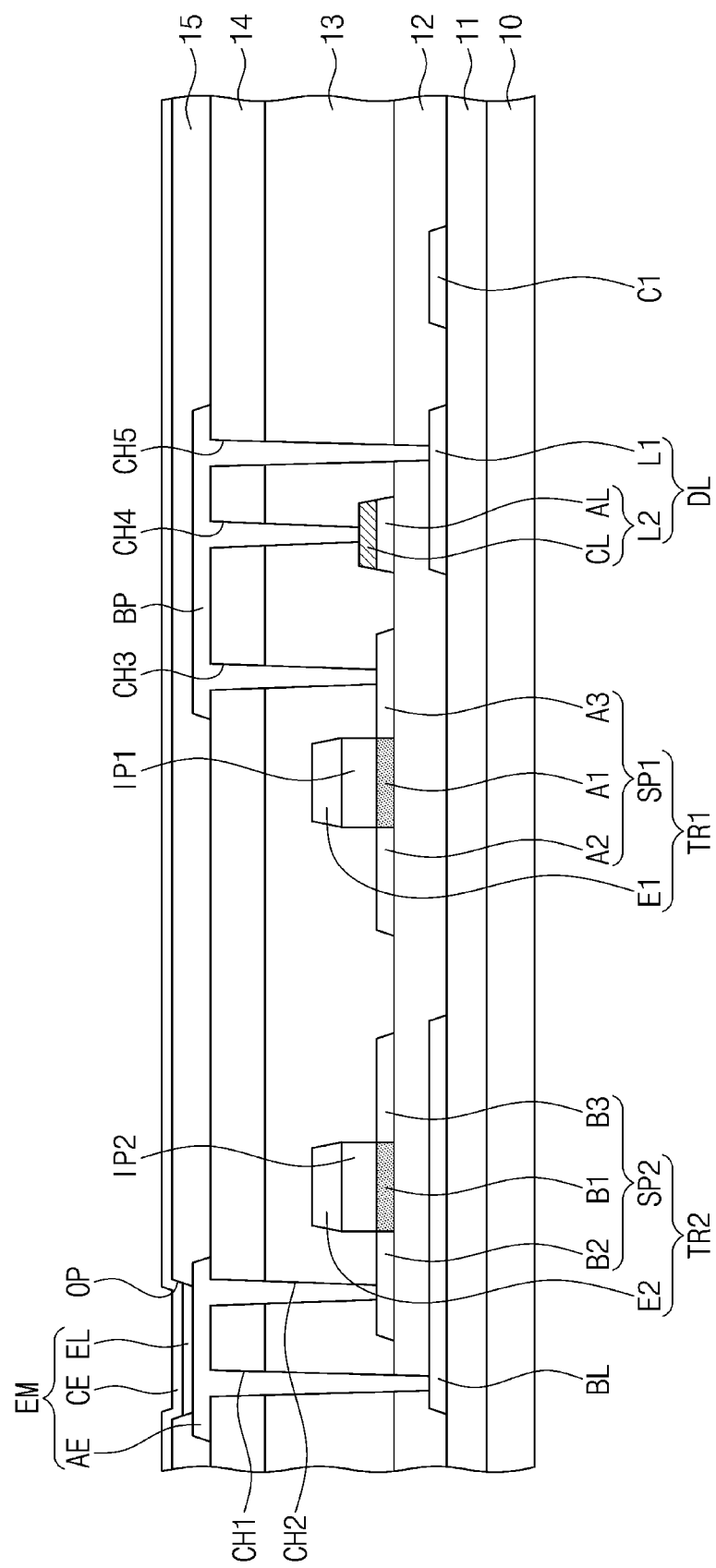
FIG. 3 is a schematic cross-sectional view of an electronic apparatus according to an embodiment.

FIG. 3 is a schematic cross-sectional view of an electronic apparatus according to an embodiment. To facilitate the description, FIG. 3 illustrates a base substrate 10, insulation layers 11, 12, 13, 14, and 15, a blocking layer BL, a first transistor TR1, a second transistor TR2, a first electrode C1 of the capacitor CP, a data line DL, and a light emitting element EM among components of an electronic apparatus 100.

The base substrate 10 may have insulation properties. The base substrate 10 may include a multi-layered structural body including glass, plastic, a polymer film, or an organic film and an inorganic film.

The insulation layers 11, 12, 13, 14, and 15 may include first to fifth insulation layers 11, 12, 13, 14, and 15 stacked on the base substrate 10. Each of the insulation layers 11, 12, 13, 14, and 15 may be an organic film or an inorganic film. For example, a first insulation layer 11 and a second insulation layer 12 may be inorganic films and third to fifth insulation layers 13, 14, and 15 may be organic films. However, this is only an example. Each of the first to fifth insulation layers 11, 12, 13, 14, and 15 is not limited to any one embodiment. The insulation layers 11, 12, 13, 14, and 15 may include an additional insulation layer in addition to the five insulation layers, and are not limited to any one embodiment.

The blocking layer BL may be disposed between the base substrate 10 and the first insulation layer 11. The blocking layer BL may include a metal. The blocking layer BL may overlap a transistor in a plan view. In an embodiment, the blocking layer BL may overlap the second transistor TR2.

The first transistor TR1 may be electrically connected to the data line DL. The first transistor TR1 may correspond to the second transistor T2 illustrated in FIG. 2 (see FIG. 2). The first transistor TR1 may include a semiconductor pattern SP1 (hereinafter, a first semiconductor pattern) and a control electrode E1 (hereinafter, a first control electrode). The first semiconductor pattern SP1 may include an oxide semiconductor material.

The first semiconductor pattern SP1 may be disposed between the second insulation layer 12 and the third insulation layer 13. The first semiconductor pattern SP1 may include a channel unit A1, an input unit A2, and an output unit A3. The channel unit A1, the input unit A2, and the output unit A3 may be portions separated in a plan view of the first semiconductor pattern SP1. The channel unit A1 may have lower conductivity than the input unit A2 and the output unit A3.

In an embodiment, the input unit A2 and the output unit A3 may include a reduced metal. The input unit A2 and the output unit A3 may function as a source electrode and a drain electrode of the first transistor TR1. However, this is only an example. The first transistor TR1 may include a separate source electrode and a separate drain electrode contacting the input unit A2 and the output unit A3, and is not limited to any one embodiment.

The first control electrode E1 may have conductivity. The first control electrode E1 may be spaced apart from the first semiconductor pattern SP1 having a first insulation pattern IP1 therebetween. The first insulation pattern IP1 may be self-aligned through the first control electrode E1. The first control electrode E1 may overlap the channel unit A1 of the semiconductor pattern SP1 in a plan view.

The second transistor TR2 may be electrically connected to the light emitting element EM. The second transistor TR2 may correspond to the sixth transistor T6 illustrated in FIG. 2 (see FIG. 2). The second transistor TR2 may include a semiconductor pattern SP2 (hereinafter, a second semiconductor pattern) and a control electrode E2 (hereinafter, a second control electrode).

The second semiconductor pattern SP2 may be disposed between the second insulation layer 12 and the third insulation layer 13. In an embodiment, the second semiconductor pattern SP2 may be disposed on the same layer as the first semiconductor pattern SP1. The second semiconductor pattern SP2 may be disposed to overlap the blocking layer BL. The second semiconductor pattern SP2 may include an oxide semiconductor material. The second semiconductor pattern SP2 may include a channel unit B1, an input unit B2, and an output unit B3.

The second control electrode E2 may have conductivity. The second control electrode E2 may be disposed spaced apart from the semiconductor pattern SP2 in a plan view and may overlap the channel unit B1 of the second semiconductor pattern SP2 in a plan view. The second control electrode E2 may be spaced apart from the second semiconductor pattern SP2 having a second insulation pattern IP2 therebetween. The second insulation pattern IP2 may be self-aligned through the second control electrode E2.

The light emitting element EM may be electrically connected to the second transistor TR2. The light emitting element EM may correspond to the first light emitting element LD1 illustrated in FIG. 2. The light emitting element EM may include an anode electrode AE, a light emitting pattern EP, and a cathode electrode CE. The anode electrode AE may be disposed between the fourth insulation layer 14 and the fifth insulation layer 15. At least a portion of the anode electrode AE may be exposed by an opening OP defined on the fifth insulation layer 15. The light emitting pattern EP may be disposed in the opening OP and may be disposed between the anode electrode AE and the cathode electrode CE. The light emitting pattern EP may include an organic light emitting material or an inorganic light emitting material, and is not limited to any one embodiment. The cathode electrode CE may be disposed on the fifth insulation layer 15. The light emitting element EM may excite the light emitting pattern EP through a voltage difference between the anode electrode AE and the cathode electrode CE and may emit light.

The anode electrode AE may be electrically connected to the blocking layer BL and the second transistor TR2 through the insulation layers 12, 13, and 14. The anode electrode AE may be directly electrically connected to the input unit B2 of the second semiconductor pattern SP2. However, this is an illustrated example. According to an embodiment, a separate input electrode which contacts the input unit B2 may be provided and the anode electrode AE may be electrically connected to the input electrode, and is not limited to any one embodiment.

The data line DL corresponds to the data line DL1 (see FIG. 2) illustrated in FIG. 2. The data line DL may include a first line L1 and a second line L2 which may be disposed on different layers. The first line L1 may be disposed on the same layer as the blocking layer BL, and the second line L2 may be disposed on the same layer as the first semiconductor pattern SP1.

The second line L2 may include a first layer AL and a second layer CL. The first layer AL may include an oxide semiconductor material containing tin (Sn). The second layer CL may include a transparent conductive oxide. Meanwhile, the second layer CL may have a crystalline crystal structure.

The first layer L1 may have a larger area than the second line L2. The first layer L1 may have a higher conductivity than the second line L2. Accordingly, by securing a large area of the first line L1 which may be disposed on a different layer from the second line L2, the conductivity of the data line DL may be stably secured without interference with adjacent components such as the first semiconductor pattern SP1.

The first line L1 and the second line L2 may be electrically connected through a bridge pattern BP. In an embodiment, the bridge pattern BP may be disposed on the same layer as the anode electrode AE, and may be electrically connected to the first line L1 and the second line L2 through the insulation layers.

According to an embodiment, by configuring the data line DL as two lines L1 and L2, the wiring resistance may be reduced. The two lines may be disposed on different layers from each other, and thus, may be easily formed in a narrow region. According to the disclosure, the data line DL may be provided as two lines, so that it may be possible to drive the pixel PX at a high speed and to stably form two conductive lines in a narrow region.

Figure 4A:
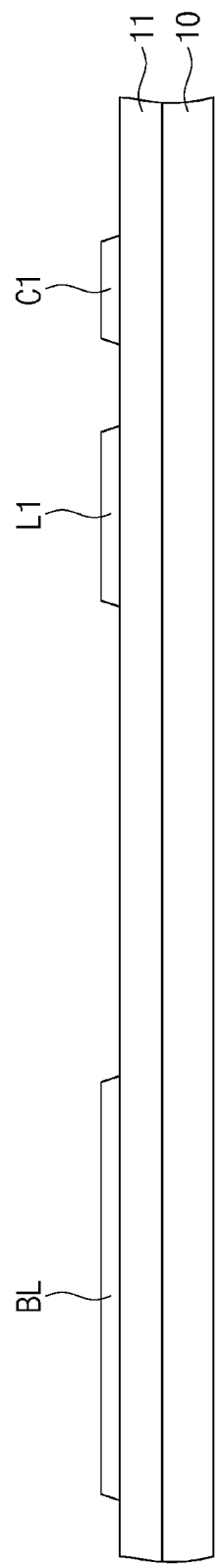
FIG. 4A to FIG. 4P are schematic cross-sectional views for explaining a method for manufacturing an electronic apparatus according to an embodiment.
Figure 4B:
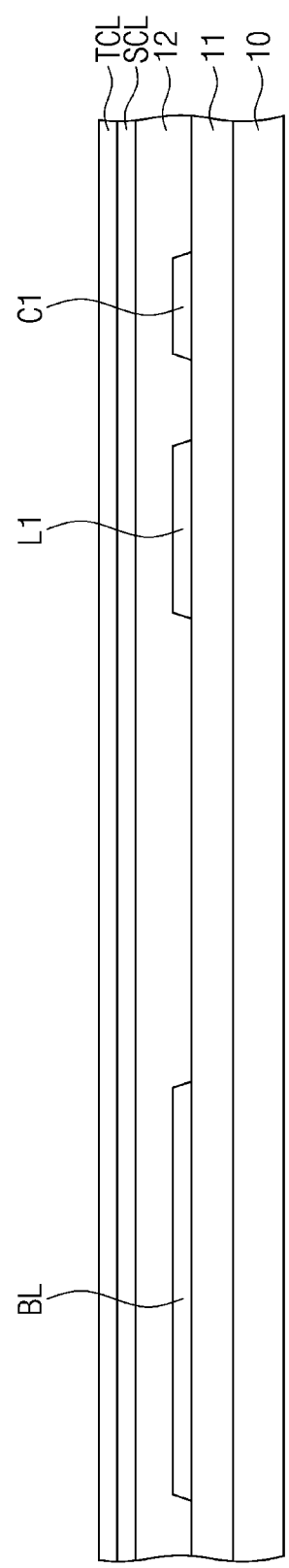
Figure 4C:
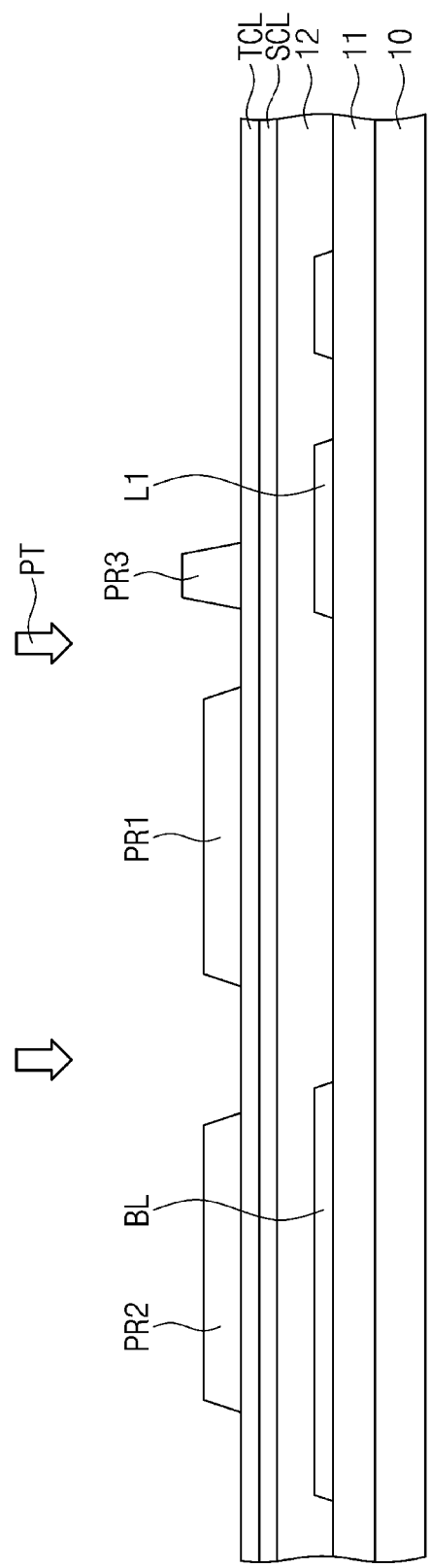
Figure 4D:
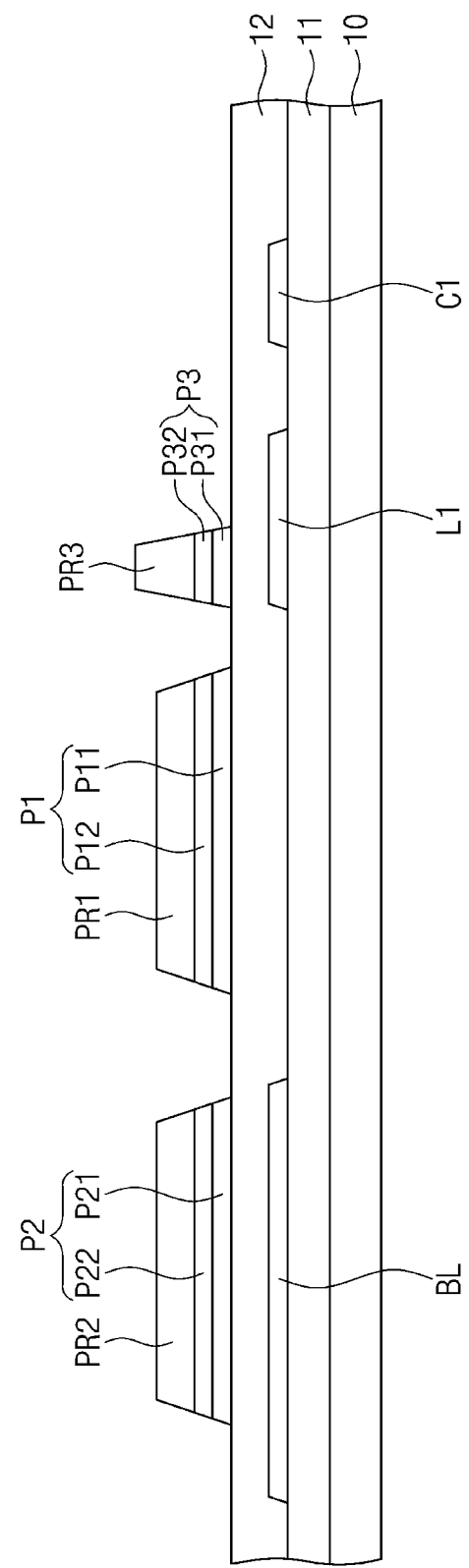
Figure 4E:
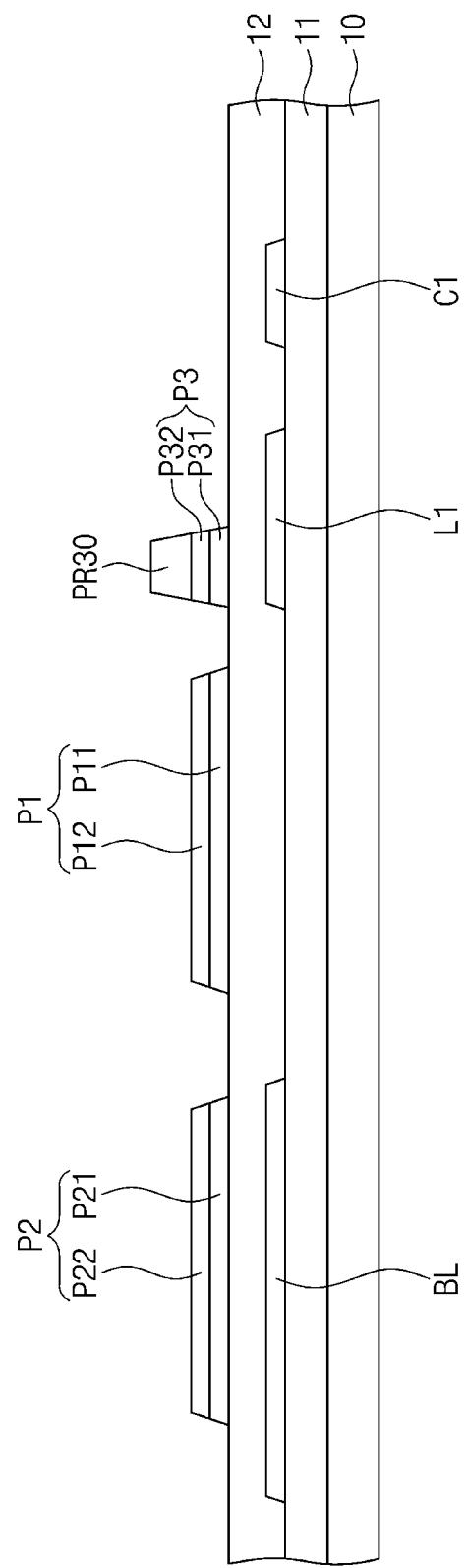
Figure 4F:
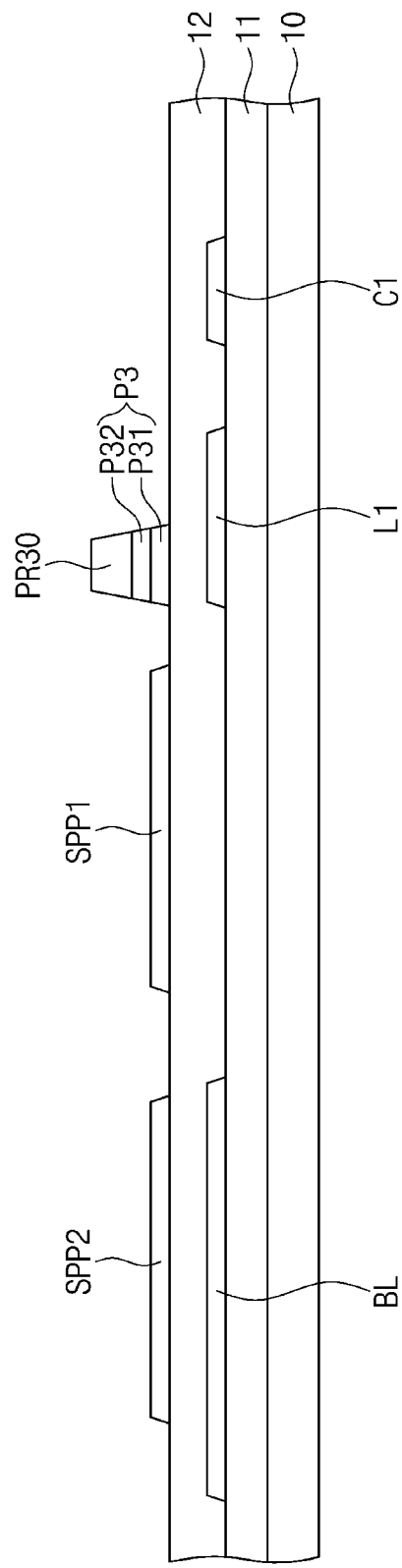
Figure 4G:
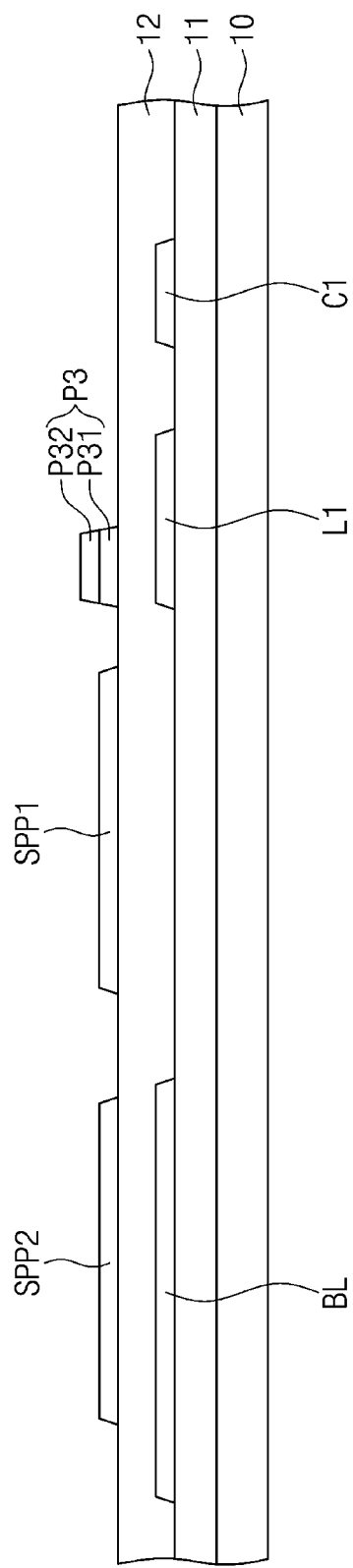
Figure 4H:
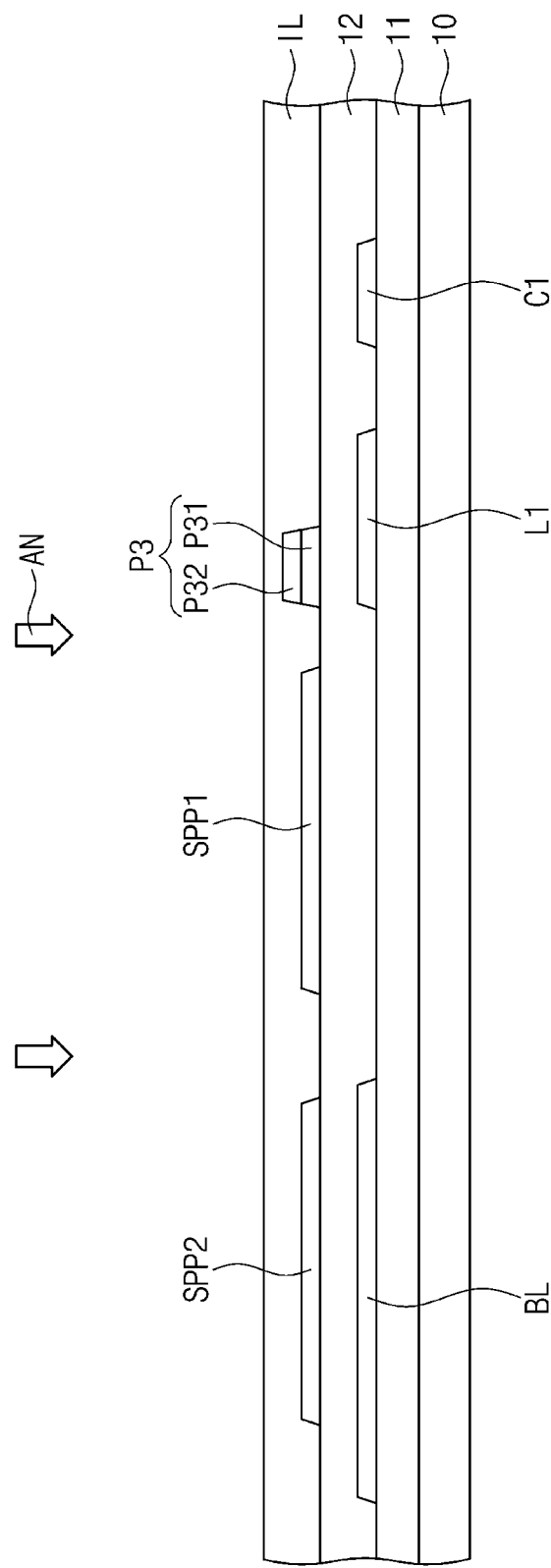
Figure 4I:
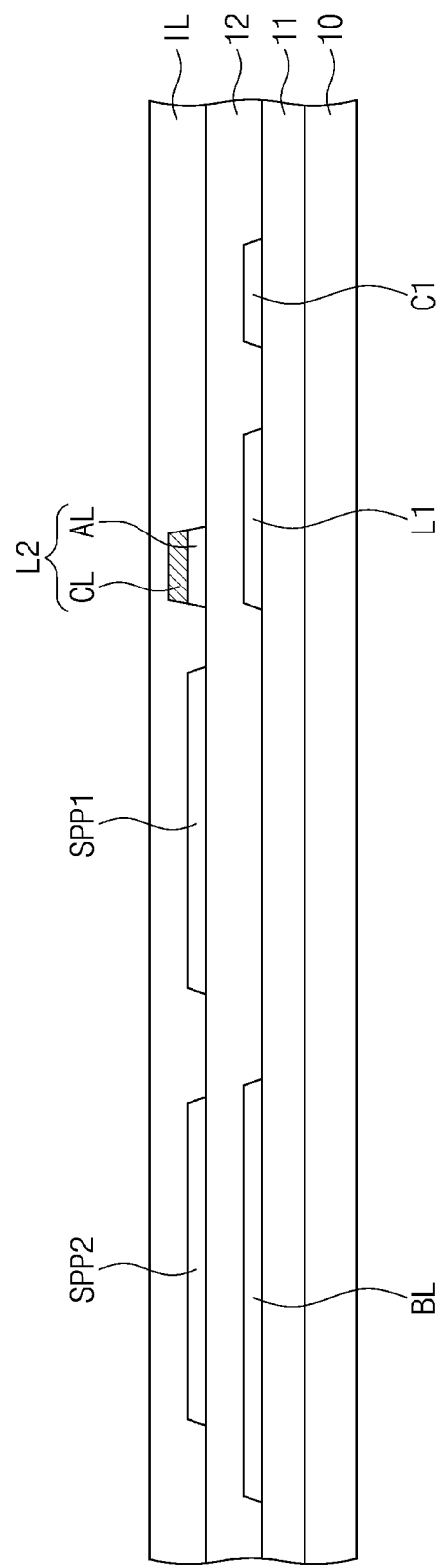
Figure 4J:
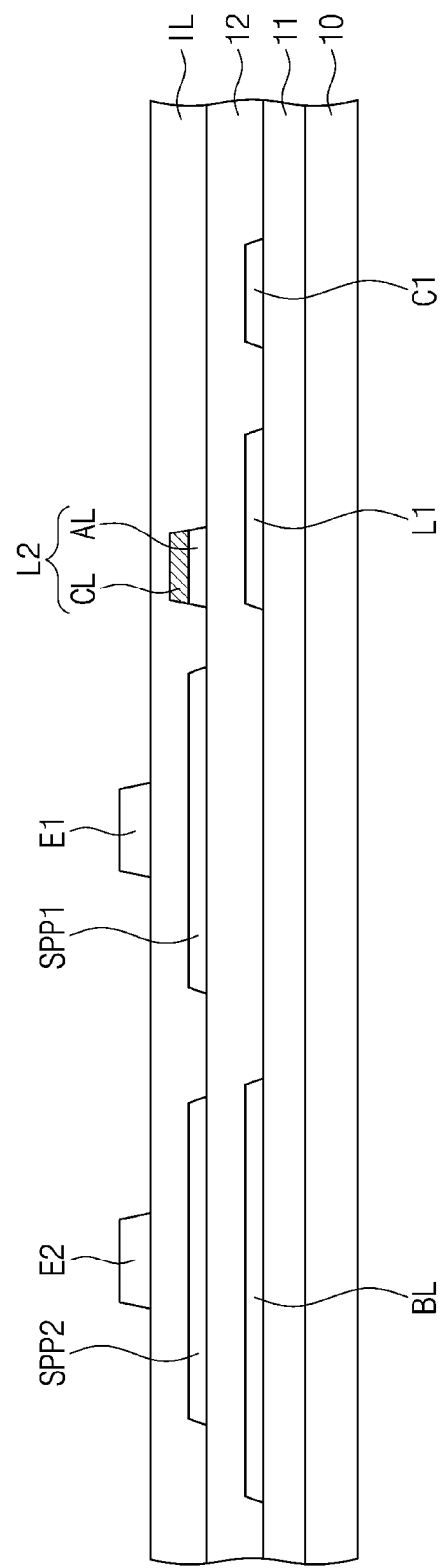
Figure 4K:
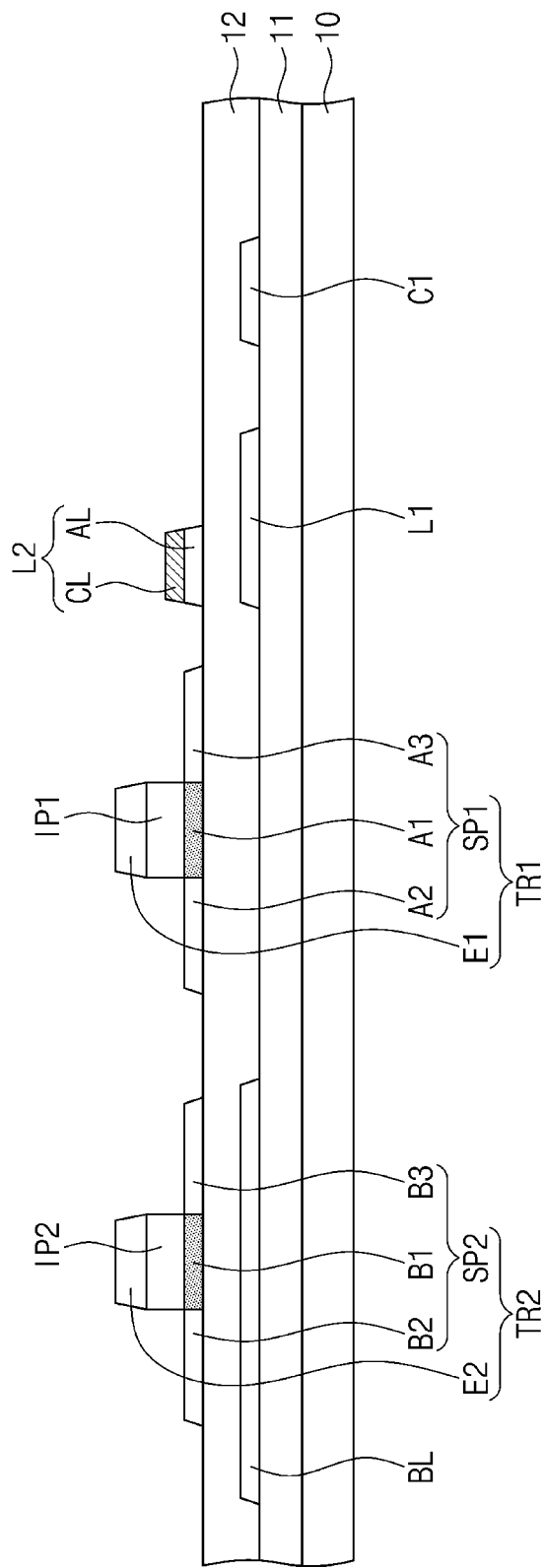
Figure 4L:
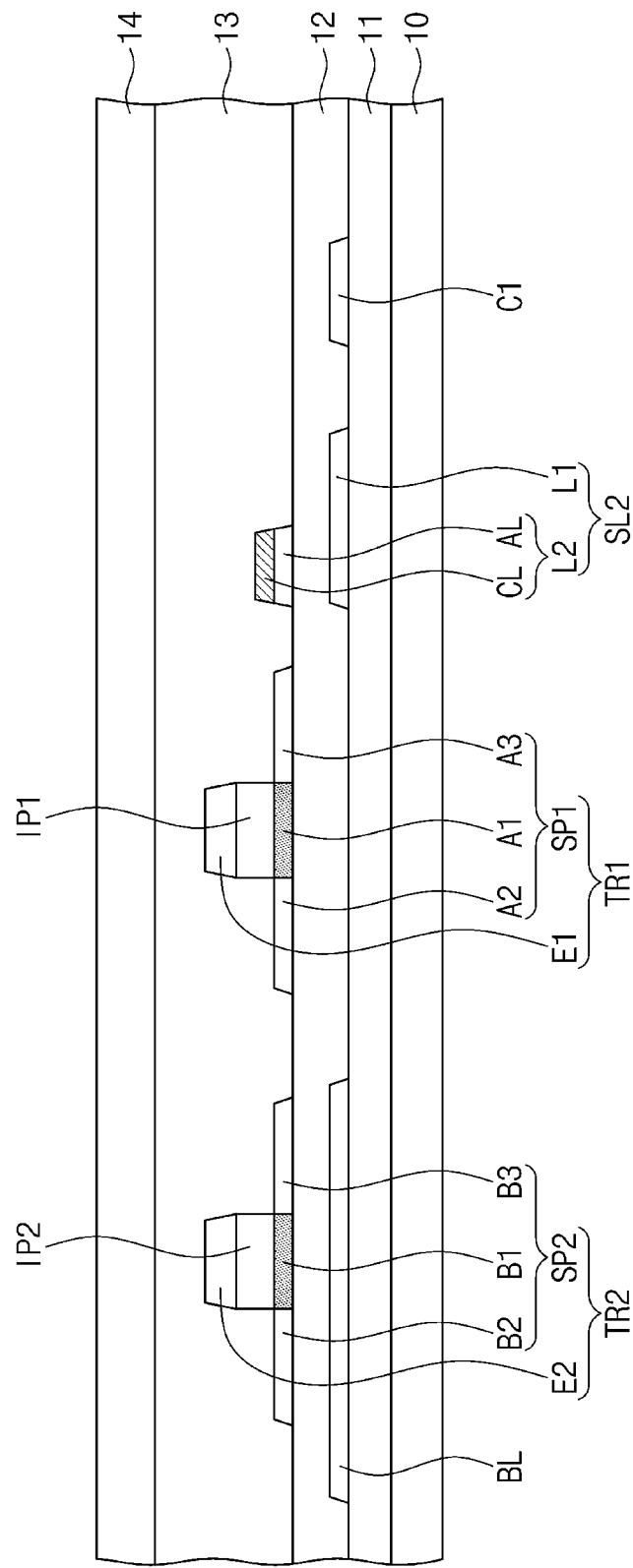
Figure 4M:
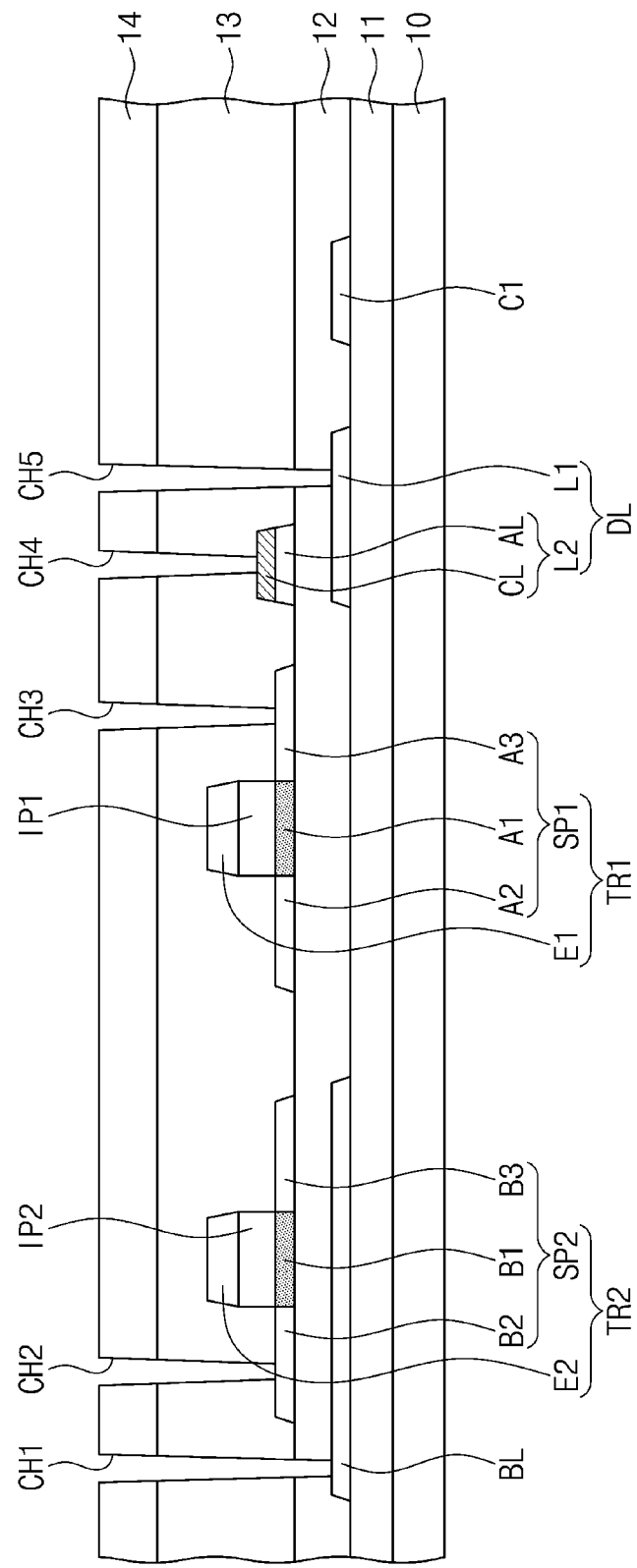
Figure 4N:
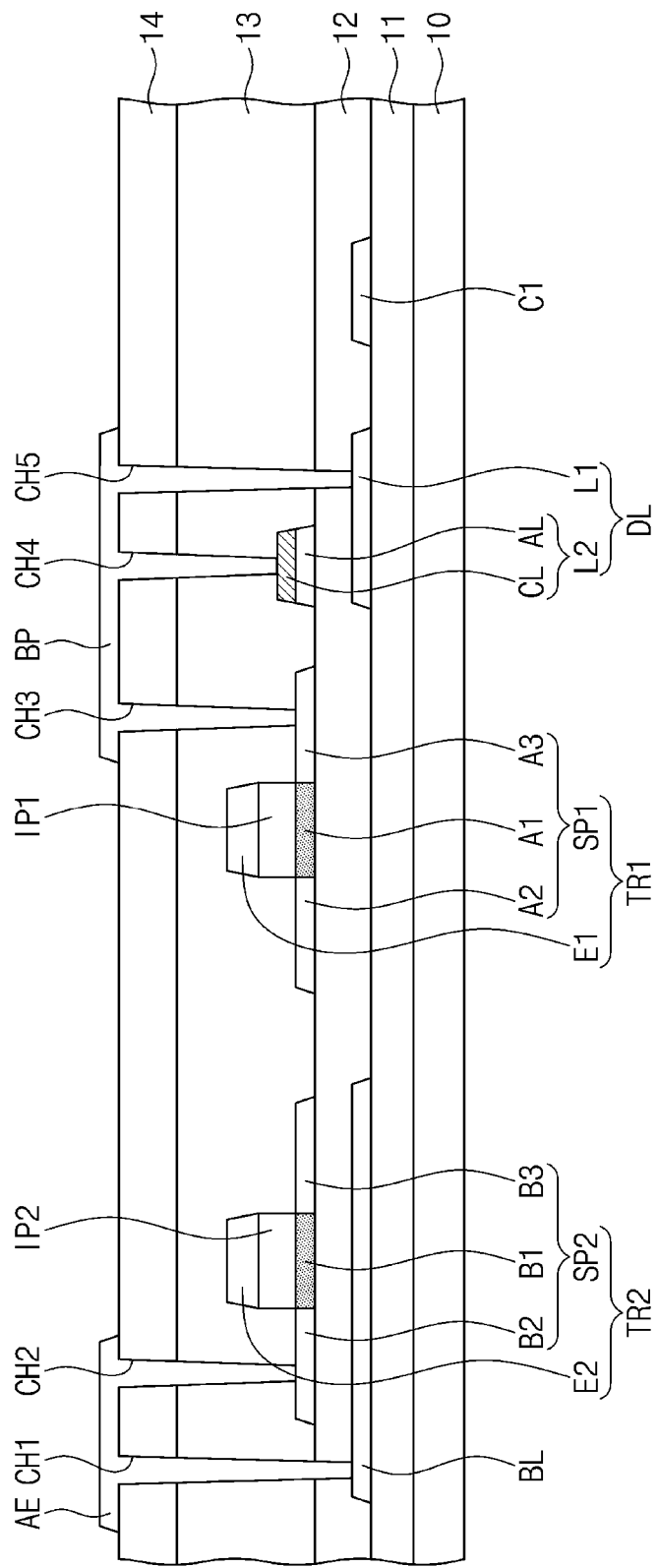
Figure 40:
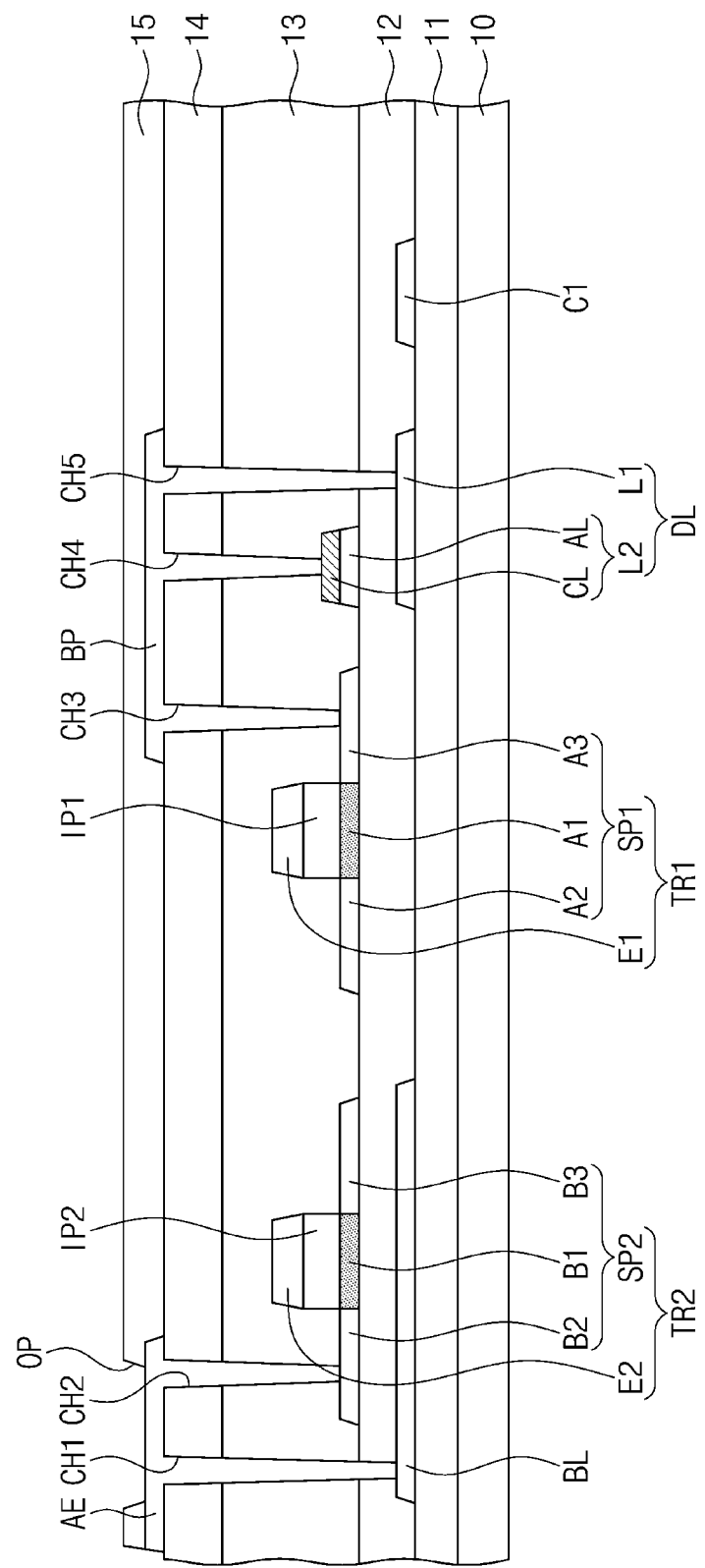
Figure 4P:
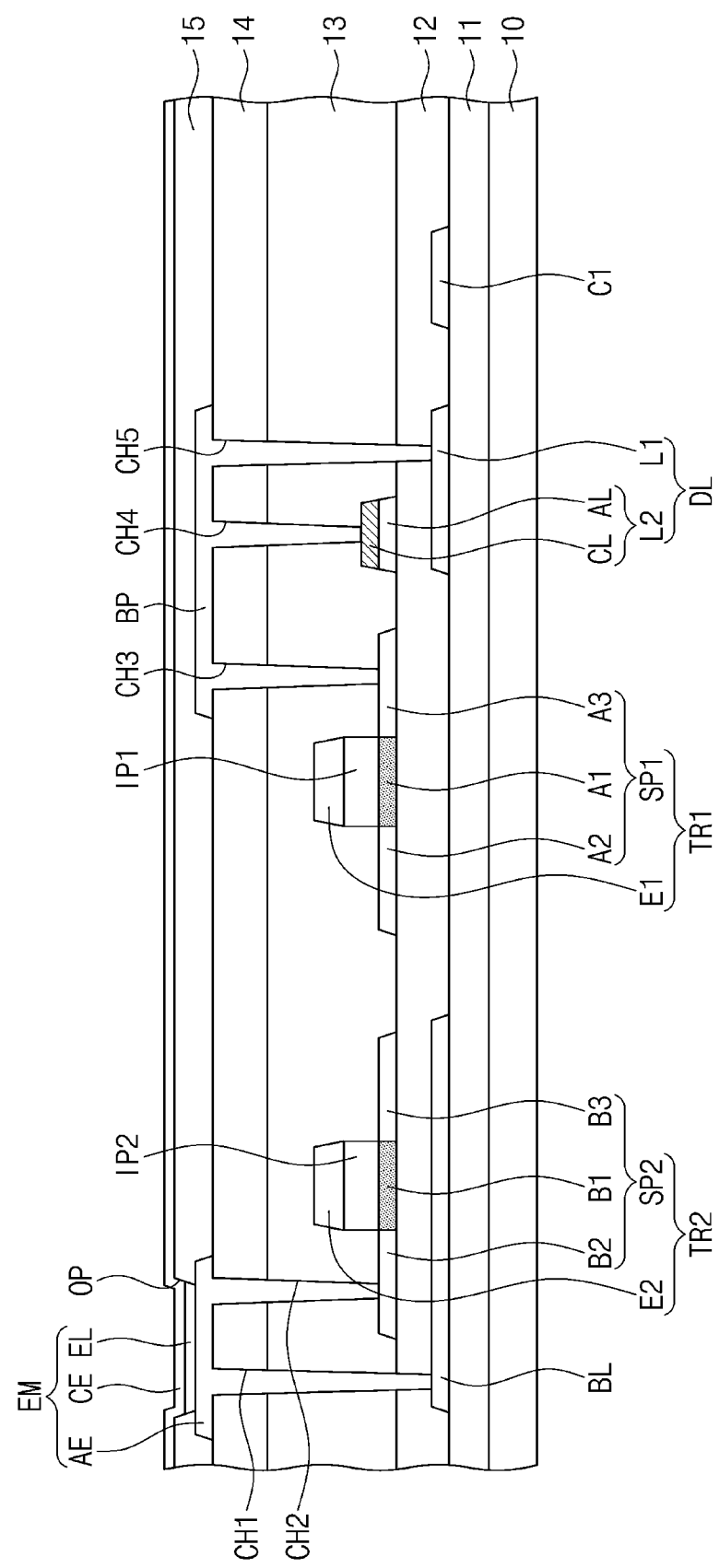

FIG. 4A to FIG. 4P are schematic cross-sectional views for explaining a method for manufacturing an electronic apparatus according to an embodiment. Hereinafter, with reference to FIG. 4A to FIG. 4P, the disclosure will be described.

As illustrated in FIG. 4A, the first insulation layer 11, the blocking layer BL, the first line L1 of the data line DL (see FIG. 3), and the first electrode C1 of the capacitor CP (see FIG. 3) may be formed or disposed on the base substrate 10. The blocking layer BL, the first line L1, and the first electrode C1 may be formed by depositing and then patterning a conductive material.

Thereafter, as illustrated in FIG. 4B, the second insulation layer 12, a semiconductor layer SCL, and a conductive oxide layer TCL may be sequentially formed. The semiconductor layer SCL may be formed by depositing or coating an oxide semiconductor material containing tin (Sn). The conductive oxide layer TCL may include a transparent conductive oxide material having an amorphous crystal structure. For example, the conductive oxide layer TCL may be formed of a transparent conductive oxide such as an amorphous tin oxide, an amorphous indium tin oxide, an amorphous indium zinc tin oxide, and the like within the spirit and the scope of the disclosure.

Thereafter, as illustrated in FIG. 4C and FIG. 4D, the semiconductor layer SCL and the conductive oxide layer TCL may be patterned PT to form patterns P1, P2, and P3. On the conductive oxide layer TCL, mask patterns PR1, PR2, and PR3 may be formed or disposed, and based on the mask patterns PR1, PR2, and PR3, the patterns P1, P2, and P3 may be formed. The mask patterns PR1, PR2, and PR3 may be half-tone masks. First and second mask patterns PR1 and PR2 of the mask patterns PR1, PR2, and PR3 may have a smaller thickness than a third mask pattern PR3.

The patterns P1, P2, and P3 may be formed through an etching process. An etchant may be a sodium sulfate (SPS). The etchant may react with both of the semiconductor layer SCL and the conductive oxide layer TCL. Accordingly, a first pattern P1 may include a first layer P11 formed from the semiconductor layer SCL and a second layer P12 formed from the conductive oxide layer TCL.

A second pattern P2 may include a first layer P21 formed from the semiconductor layer SCL and a second layer P22 formed from the conductive oxide layer TCL. The second pattern P2 may be formed in a region overlapping the blocking layer BL in a plan view. A third pattern P3 may include a first layer P31 formed from the semiconductor layer SCL and a second layer P32 formed from the conductive oxide layer TCL.

Thereafter, as illustrated in FIG. 4E, through an ashing process, the first mask pattern PR1 which has formed the first pattern P1 and the second mask pattern PR2 which has formed the second pattern P2 among the mask patterns PR1, PR2, and PR3 may be removed. At this time, the third mask pattern PR3 which has formed the third pattern P3 may be a third mask pattern PR30 with reduced thickness.

Thereafter, as illustrated in FIG. 4F, the second layer P12 of the first pattern P1 and the second layer P22 of the second pattern P2 may be removed to form first and second preliminary semiconductor patterns SPP1 and SPP2. The second layer P12 of the first pattern P1 and the second layer P22 of the second pattern P2 may be removed by an etchant. At this time, as the etchant, a sulfuric acid-based or a nitric acid-based etchant may be used.

The first and second preliminary semiconductor patterns SPP1 and SPP2 may be formed by the remaining first layer P11 of the first pattern P1 and the remaining first layer P21 of the second pattern P2. At this time, the second layer P32 of the third pattern P3 may be covered or overlapped by the mask pattern PR30 and not removed.

According to the disclosure, the first layers P11 and P21 may be formed of a material containing tin (Sn), and thus, may not be damaged by a sulfuric acid-based or a nitric acid-based etchant. Accordingly, during a process for removing the second layers P12 and P22, the first and second preliminary semiconductor patterns SPP1 and SPP2 may be stably formed.

Thereafter, as illustrated in FIG. 4G, the third mask pattern PR30 may be removed through an ashing process.

Thereafter, as illustrated in FIG. 4H and FIG. 4I, an insulation layer IL may be formed, and then, through a heat-treatment process, AN, the second layer P32 of the third pattern P3 may be crystallized to form the second line L2 of the data line DL. The second layer P32 of the third pattern P3 may be formed through heat-treatment AN as the second layer CL having a crystalline structure, and the first layer P31 of the third pattern P3 may become the first layer AL of the second line L2. The second layer CL may have a crystalline crystal structure, and thus, may have a relatively high conductivity when compared to an amorphous crystal structure.

The data line DL may include the second line L2 having a stacking structure of the first layer AL formed of a semiconductor material and the second layer CL formed of a crystalline oxide semiconductor material. According to the disclosure, the second line L2 may be formed by additionally performing a heat-treatment process on a pattern simultaneously formed during a process for forming the preliminary semiconductor patterns SPP1 and SPP2. Therefore, an existing patterning process may be used without further adding a separate patterning process for forming the second line L2, so the entire process may be simplified.

Thereafter, as illustrated in FIG. 4J, the first control electrode E1 and the second control electrode E2 may be formed or disposed on the insulation layer IL. The first control electrode E1 and the second control electrode E2 may be simultaneously patterned through one mask.

Thereafter, as illustrated in FIG. 4K, the insulation layer IL may be patterned to form the first insulation pattern IP1 and the second insulation pattern IP2. The insulation layer IL may be patterned using the first control electrode E1 and the second control electrode E2 as a mask.

The first and second preliminary semiconductor patterns SPP1 and SPP2 may be formed as the first and second semiconductor patterns SP1 and SP2 through a reduction process. During the reduction process, portions exposed from the insulation patterns IP1 and IP2 may be reduced and become the input units A2 and B2 and the output units A3 and B3, and portions covered or overlapped by the insulation patterns IP1 and IP2 may be reduced and become the channel units A1 and B1. The transistors TR1 and TR2 according to an embodiment may be self-aligned through the control electrodes E1 and E2.

Thereafter, as illustrated in FIG. 4L, the third insulation layer 13 and the fourth insulation layer 14 may be sequentially formed.

Thereafter, as illustrated in FIG. 4M and FIG. 4N, the anode electrode AE and the bridge pattern BP may be formed. Through-holes CH1, CH2, CH3, CH4, and CH5 may be formed in the second to fourth insulation layer 12, 13, and 14. Thereafter, the anode electrode AE and the bridge pattern BP may be formed by depositing and patterning a conductive material on the fourth insulation layer 14. In an embodiment, the anode electrode AE and the bridge pattern BP may be formed of the same or similar material and may be simultaneously patterned using one mask.

The anode electrode AE may be electrically connected to the blocking layer BL and the second transistor TR2 through a first through-hole CH1 and a second through-hole CH2, respectively. The anode electrode AE may electrically connect the blocking layer BL and the input unit B2 of the second semiconductor pattern SP2.

The bridge pattern BP may be electrically connected to the first transistor TR1 and the data line DL through third to fifth through-holes CH3, CH4, and CH5, respectively. The bridge pattern BP may electrically connect the output unit A3 of the first semiconductor pattern SP1 and the data line DL. Also, the bridge pattern BP may electrically connect the first line L1 and the second line L2 of the data line DL.

Thereafter, as illustrated in FIG. 4O, the fifth insulation layer 15 may be formed. The opening OP may be formed in the fifth insulation layer 15 to expose at least a portion of the anode electrode AE.

Thereafter, as illustrated in FIG. 4P, the light emitting pattern EL and the cathode electrode CE may be formed to form the light emitting element EM. The light emitting pattern EL may fill the opening OP and the cathode electrode CE may be formed or disposed to cover or overlap the entire surface of the fifth insulation layer 15. However, this is an example. The light emitting pattern EL and the cathode electrode CE may be provided in various shapes, and are not limited to any one embodiment.

According to the disclosure, a signal may be provided through lines, so that it may be possible to drive an electronic apparatus at a high speed. In addition, it may be possible to easily add a signal line even in a narrow space. Furthermore, according to the disclosure, it may be possible to additionally form a signal line without adding masks, so that processing cost may be reduced.

Although the disclosure has been described with reference to embodiments, it will be understood by those skilled in the art that various changes in form and details may be made therein without departing from the spirit and scope of the disclosure. Accordingly, the disclosure is not intended to be limited to the contents set forth in the detailed description of the specification, but is intended to be defined by the appended claims.

What is claimed is:

1. An electronic apparatus comprising:
   a first transistor comprising a first oxide semiconductor pattern;
   a second transistor comprising a second oxide semiconductor pattern spaced apart from the first oxide semiconductor pattern of the first transistor;
   a blocking layer disposed below the second transistor and including a conductive material;
   a signal line electrically connected to the first transistor and comprising a first line and a second line which are disposed on different layers;
   a bridge pattern electrically connected to each of the first transistor, the first line of the signal line, and the second line of the signal line;
   a first insulation layer disposed between the first line of the signal line and the second line of the signal line; and
   a second insulation layer disposed between the first transistor and the bridge pattern, wherein
   the first line of the signal line and the blocking layer are disposed on a same layer, and
   the second line of the signal line and the first oxide semiconductor pattern are disposed on a same layer.

2. The electronic apparatus of claim 1, wherein the second line of the signal line comprises a first layer and a second layer which are sequentially stacked.

3. The electronic apparatus of claim 2, wherein the first layer of the second line of the signal line comprises an oxide semiconductor.

4. The electronic apparatus of claim 3, wherein the first layer of the second line of the signal line includes tin.

5. The electronic apparatus of claim 3, wherein the second layer of the second line of the signal line includes a crystalline structure.

6. The electronic apparatus of claim 5, wherein the second layer of the second line of the signal line includes a transparent conductive oxide.

7. The electronic apparatus of claim 2, wherein the first layer of the second line of the signal line and the first oxide semiconductor pattern include a same material.

8. The electronic apparatus of claim 1, wherein the bridge pattern electrically contacts the first semiconductor pattern through the second insulation layer.

9. The electronic apparatus of claim 1, further comprising a light emitting diode comprising:
   an anode electrode electrically connected to the second transistor;
   a cathode electrode disposed on the anode electrode; and
   a light emitting pattern disposed between the anode electrode and the cathode electrode,
   wherein the bridge pattern and the anode electrode are disposed on a same layer.

10. The electronic apparatus of claim 9, wherein the anode electrode is electrically connected to the second semiconductor pattern and the blocking layer.

11. An electronic apparatus comprising:
    a first transistor comprising an oxide semiconductor pattern;
    a first line spaced apart from the first transistor in a plan view;
    a second line spaced apart from the first transistor in a plan view, wherein the first line and the second line are disposed on different layers and include a different material;
    a blocking layer overlapping the oxide semiconductor pattern of the first transistor, the blocking layer and the first line being disposed on a same layer; and
    a bridge pattern electrically connected to the first transistor, the first line, and the second line, wherein the bridge pattern, the first line, and the second line are disposed on different layers,
    wherein the second line includes:
      a first layer including an oxide semiconductor pattern; and
      a second layer disposed on the first layer and including a conductive oxide.

12. The electronic apparatus of claim 11, wherein the oxide semiconductor pattern of the first transistor and the second line are disposed on a same layer.

13. The electronic apparatus of claim 12, wherein the first layer includes tin.

14. The electronic apparatus of claim 13, wherein the second layer includes a crystalline structure.

15. The electronic apparatus of claim 12, wherein the first line and the blocking layer include a same material.

16. A method for manufacturing an electronic apparatus, the method comprising:
    forming a blocking layer and a first line on a substrate;
    forming an insulation layer overlapping the blocking layer and the first line;
    forming an oxide semiconductor layer and a conductive oxide layer sequentially on the insulation layer;
    patterning the oxide semiconductor layer and the conductive oxide layer to form a first pattern, a second pattern, and a third pattern spaced apart from each other;
    removing the conductive oxide layer of each of the first pattern and the second pattern;
    heat-treating the conductive oxide layer of the third pattern to form a second line; and
    forming a bridge pattern electrically connecting the second line and the first line.

17. The method of claim 16, wherein the oxide semiconductor layer includes a semiconductor material including tin.

18. The method of claim 16, wherein the removing of the conductive oxide layer of each of the first pattern and the second pattern is performed using a sulfate-based or nitrate-based etchant.

19. The method of claim 16, wherein the forming of the first pattern, the second pattern, and the third pattern spaced apart from each other is formed using a half-tone mask.

20. The method of claim 16, further comprising:
forming an anode electrode, a light emitting pattern, and a cathode electrode after the forming of the second line,
wherein the forming of the anode electrode includes forming the anode electrode and the bridge pattern simultaneously.

* * * * *